(12) United States Patent
Noma

(10) Patent No.: US 7,397,134 B2
(45) Date of Patent: Jul. 8, 2008

(54) SEMICONDUCTOR DEVICE MOUNTED ON AND ELECTRICALLY CONNECTED TO CIRCUIT BOARD

(75) Inventor: Takashi Noma, Ota (JP)

(73) Assignee: Sanyo Electric Co., Ltd., Osaka (JP)

(*) Notice: Subject to any disclaimer, the term of this patent is extended or adjusted under 35 U.S.C. 154(b) by 325 days.

(21) Appl. No.: 11/145,176

(22) Filed: Jun. 6, 2005

(65) Prior Publication Data
US 2005/0275093 A1    Dec. 15, 2005

(30) Foreign Application Priority Data
Jun. 10, 2004   (JP)   ............................. 2004-172603
Apr. 15, 2005   (JP)   ............................. 2005-117857

(51) Int. Cl.
*H01L 23/498*   (2006.01)
(52) U.S. Cl. ........................ 257/778; 257/779; 257/784; 257/E23.02; 361/761
(58) Field of Classification Search ........... 257/E23.024
See application file for complete search history.

(56) References Cited

U.S. PATENT DOCUMENTS 6,630,736 B1 * 10/2003 Ignaut ........................ 257/737

2002/0100986 A1 * 8/2002 Soga et al. .................. 257/779
2002/0113323 A1 * 8/2002 Nakanishi et al. ........... 257/784
2005/0046035 A1 * 3/2005 Egawa ........................ 257/777

FOREIGN PATENT DOCUMENTS

| JP | 2001-223288 A | 8/2001 |
| JP | 2002-512436 | 4/2002 |
| WO | WO-99/40624 | 8/1999 |

* cited by examiner

*Primary Examiner*—Stephen W Smoot
(74) *Attorney, Agent, or Firm*—Morrison & Foerster LLP

(57) ABSTRACT

The invention provides a package type semiconductor device and a manufacturing method thereof where reliability is improved without increasing a manufacturing cost. A resin layer and a supporting member are formed on a top surface of a semiconductor substrate formed with pad electrodes. Then, openings are formed penetrating the resin layer and the supporting member so as to expose the pad electrodes. Metal layers are then formed on the pad electrodes exposed in the openings, and conductive terminals are formed thereon. Finally, the semiconductor substrate is separated into semiconductor dice by dicing. When this semiconductor device is mounted on a circuit board (not shown), the conductive terminals of the semiconductor die and external electrodes of the circuit board are electrically connected with each other.

25 Claims, 13 Drawing Sheets

SEMICONDUCTOR DEVICE MOUNTED ON AND ELECTRICALLY CONNECTED TO CIRCUIT BOARD

CROSS-REFERENCE OF THE INVENTION

This invention is based on Japanese Patent Application Nos. 2004-172603 and 2005-117857, the content of which is incorporated by reference in its entirety.

BACKGROUND OF THE INVENTION

1. Field of the Invention

The invention relates to a semiconductor device and a manufacturing method thereof, particularly to a package type semiconductor device and a manufacturing method thereof.

2. Description of the Related Art

CSP (Chip Size Package) has been pursued as a package type semiconductor device. The CSP means a small package having almost the same outside dimensions as those of a semiconductor die packaged in it.

Conventionally, a BGA (Ball Grid Array) type semiconductor device has been known as a kind of CSP. In this BGA type semiconductor device, a plurality of ball-shaped conductive terminals made of a metal such as solder is arrayed in a grid pattern on one surface of the package, and electrically connected with the semiconductor die mounted on the other side of the package.

When this BGA type semiconductor device is mounted on electronic equipment, the semiconductor die is electrically connected with an external circuit on a printed circuit board by compression bonding of the conductive terminals to wiring patterns on the printed circuit board.

The conventional BGA type semiconductor device will be described as an example of the conventional package type semiconductor device next, with reference to drawings. FIGS. 26A and 26B show an outline structure of the conventional BGA type semiconductor device. FIG. 26A is an oblique perspective figure showing a top side of the BGA type semiconductor device. FIG. 26B is an oblique perspective figure showing a bottom side of the BGA type semiconductor device.

A semiconductor die 104 is sealed between a first glass substrate 102 and a second glass substrate 103 through epoxy resin layers 105a and 105b in the BGA type semiconductor device 101. Electronic devices (not shown) are formed on a top surface of the semiconductor die 104. A plurality of conductive terminals 106 is arrayed in a grid pattern on a surface of the second glass substrate 103, that is, on the bottom surface of the BGA type semiconductor device 101. The conductive terminals 106 are connected to the semiconductor die 104 through a plurality of second wirings 110. The plurality of second wirings 110 is connected with first wirings pulled out from inside of the semiconductor die 104, making each of the conductive terminals 106 electrically connected with the semiconductor die 104.

More detailed explanation on a cross-sectional structure of the BGA type semiconductor device 101 will be given hereafter referring to FIG. 27. FIG. 27 shows a cross-sectional view of the BGA type semiconductor devices 101 separated into individual dice along dicing lines.

A first wiring 107 is provided on an insulation film 108 on the top surface of the semiconductor die 104. The semiconductor die 104 is bonded to the first glass substrate 102 with the resin layer 105a. A bottom surface of the semiconductor die 104 is bonded to the second glass substrate 103 with the resin layer 105b.

One end of the first wiring 107 is connected to the second wiring 110. The second wiring 110 extends from the end of the first wiring 107 onto a surface of the second glass substrate 103. The ball-shaped conductive terminal 106 is formed on the second wiring 110 extended onto the second glass substrate 103.

The technology mentioned above is disclosed, for example, in Japanese Patent Application Publication No. 2002-512436.

However, there is a problem of making steps complex in a manufacturing process of the conventional package type semiconductor device 101. This causes a problem of increasing a manufacturing cost.

Furthermore, the reliability of the described semiconductor device 101 is not enough because of having a complex structure. For example, there is a possibility that the first wiring 107 and the second wiring 110 are disconnected at a point of contact between them, since the area of the point of contact is very small in the BGA type semiconductor device 101 described above. Also there is a problem in step coverage of the second wiring 110.

Furthermore, the semiconductor device 101 is mounted on the circuit board by connecting the ball-shaped conductive terminals 106 formed on its bottom side to the circuit board, the conductive terminals 106 facing the circuit board. Therefore, there is a problem of slanting or missetting of the semiconductor device 101. When the electronic device (not shown) is a light receiving element such as a CCD (Charge Coupled Device), the slanting or missetting causes a blur in an image taken.

As a package type semiconductor device which can prevent the manufacturing cost increase, there has been known a semiconductor device in which a semiconductor die and a circuit board are connected through bonding wire. However, such a semiconductor device can not be formed with a protection layer on its top surface, so that the top surface is exposed. This protection layer is to be provided for protecting the top surface of the semiconductor device from mechanical damage or moisture. When dust is attached to the top surface of the protection layer, the protection layer can be cleaned. Therefore, in the semiconductor device without the protection layer, there is a problem that reliability of the electronic device (not shown) and so on formed on the top surface lowers.

SUMMARY OF THE INVENTION

The invention provides a semiconductor device mounted on a circuit board having an external electrode. The device includes a semiconductor die having a top surface on which a device element is formed, a pad electrode disposed on the top surface, and a supporting member disposed on the top surface and having an opening. The pad electrode and the external electrode are electrically connected through the opening. The supporting member may be replaced by a resin layer formed on the top surface.

The invention also provides a semiconductor device assembly that includes a semiconductor device including a semiconductor die having a top surface on which a device element is formed, a pad electrode disposed on the top surface, and a supporting member disposed on the top surface and having an opening and includes a circuit board on which the semiconductor device is mounted. The circuit board includes an external electrode, and the pad electrode and the external electrode are electrically connected through the opening. The supporting member may be replaced by a resin layer formed on the top surface.

The invention further provides a method of manufacturing a semiconductor device. The method includes providing a semiconductor substrate having a pad electrode formed on a top surface thereof, attaching a supporting member to the top surface, forming an opening in the supporting member to expose at least part of the pad electrode, and cutting the semiconductor substrate along a dicing line to produce a semiconductor die. The attaching of the supporting member may be replaced by forming a resin layer on the top surface.

DETAILED DESCRIPTION OF THE INVENTION

A semiconductor device of a first embodiment of this invention will be described with reference to drawings. The manufacturing method of the semiconductor device of the first embodiment is as follows. FIGS. 1 to 6 are cross-sectional views for explaining the manufacturing method of the semiconductor device of the first embodiment. FIG. 7 is a cross-sectional view for explaining the semiconductor device and the manufacturing method thereof of the first embodiment.

FIGS. 1 to 7 show a cross-section of a semiconductor substrate 10 near a border of adjacent dice (i.e. near a dicing line (not shown)) to be separated in a dicing process which will be described below. An electronic device D is formed on a top surface of the semiconductor substrate 10 in FIGS. 1 to 7. It is noted that any number of the electronic devices D can be formed thereon. Suppose that the electronic device D is a light receiving element such as CCD (Charge Coupled Device).

Figure 1:
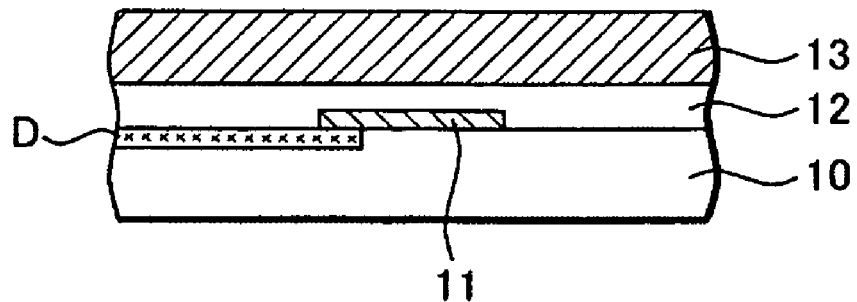
FIG. 1 is a cross-sectional view for explaining a manufacturing method of a semiconductor device of a first embodiment of the invention.

First, as shown in FIG. 1, a pad electrode 11 is formed on the top surface of the semiconductor substrate 10 with an interlayer insulation film (not shown) (e.g. made of BPSG) therebetween. This pad electrode 11 is made of metal such as aluminum, aluminum alloy, or copper, for example. On the semiconductor substrate 10 including the pad electrode 11, a passivation film (not shown) is formed, which is made of a silicon oxide film or a silicon nitride film, exposing a part of the pad electrode 11.

Then, a resin layer 12 made of, for example, epoxy resin is coated on the top surface of the semiconductor substrate 10 including the pad electrode 11. Then, a substrate-like or a tape-like supporting member 13 is bonded to the top surface of the semiconductor substrate 10 with the resin layer 12 therebetween. This supporting member 13 has a predetermined thickness. The supporting member 13 has a function of supporting and protecting the semiconductor substrate 10.

When the electronic device D is a light receiving element such as CCD, light from outside need be received by the electronic device D on the top surface of the semiconductor substrate 10 (a die 10c after completion of the semiconductor device). Thus, it is preferable that the supporting member 13 is transparent or semitransparent like a glass substrate, for example. That is, the supporting member 13 is made of an optically transparent or semitransparent glass substrate, plastic substrate such as an acrylic substrate, or silicon substrate transmitting infrared radiation. Alternatively, the supporting member 13 can be a substrate-like or tape-like one made of other material as long as it has transparency. It is also preferable that the resin layer 12 is transparent or semitransparent, like the supporting member 13.

When the electronic device D is not the light receiving element, the resin layer 12 and the supporting member 13 are not necessarily transparent or semitransparent, and can be opaque. For example, a substrate-like or tape-like material made of opaque metal or an opaque organic material can be used as the supporting member 13.

Even if dusts and foreign substances are attached to the top surface of the supporting member 13, they have no significant effect on the image formation on the light receiving element by an optical system because the thickness of the supporting member 13 is determined such that their images are not focused on the imaging plane of the light receiving element.

Next, with the supporting member 13 attached, etching is performed to a bottom surface of the semiconductor substrate 10, if required. That is, a back-grinding process is performed. Then, the bottom surface of the semiconductor substrate 10 is etched using acid (e.g. mixed solution of HF (hydrofluoric acid) and nitric acid) as an etchant. By this process, a mechanically damaged layer of the semiconductor substrate 10 occurred by the back-grinding process is removed, and the performance of the electronic device D formed on the top surface of the semiconductor substrate 10 is improved. The thickness of the completed semiconductor substrate 10 is about 130 μm in this embodiment, but the thickness can be appropriately determined according to the type of the electronic device D.

Figure 2:
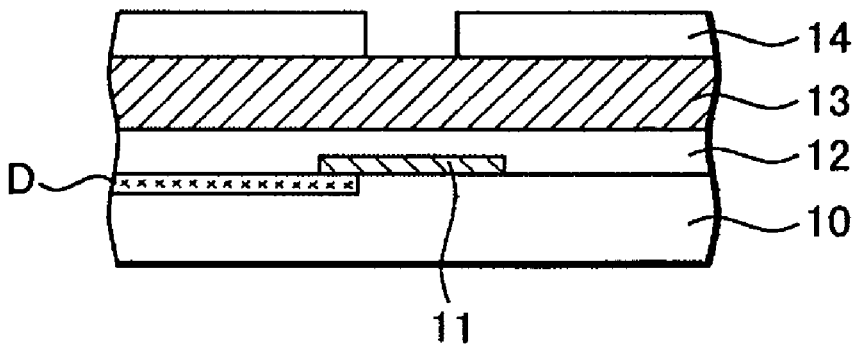
FIG. 2 is a cross-sectional view for explaining the manufacturing method of the semiconductor device of the first embodiment of the invention.

Next, as shown in FIG. 2, a resist layer 14 is selectively formed on a top surface of the supporting member 13. That is, the resist layer 14 is formed having an opening in a position corresponding to the pad electrode 11.

Figure 3:
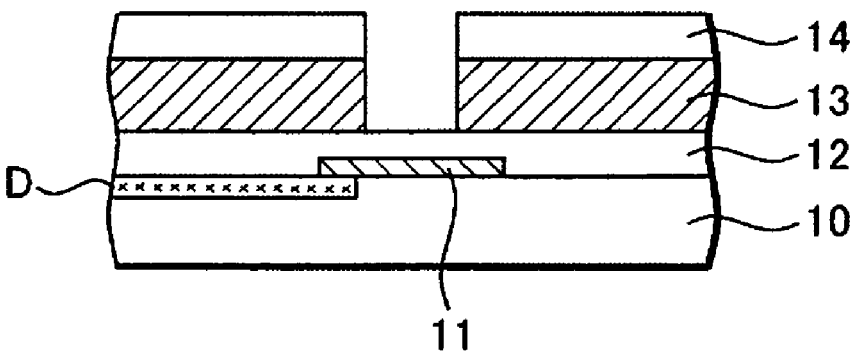
FIG. 3 is a cross-sectional view for explaining the manufacturing method of the semiconductor device of the first embodiment of the invention.

Next, as shown in FIG. 3, the supporting member 13 is selectively removed using the resist layer 14 as a mask. It is preferable that the process of selectively removing the supporting member 13 is performed by dip etching using hydrofluoric acid (HF) as an etchant. Alternatively, the process can be performed by wet etching or dry etching. By selectively removing the supporting member 13, an opening penetrating the supporting member 13 is formed. By this process, the resin layer 12 is exposed at a bottom of the opening and the pad electrode 11 lies thereunder in contact with the resin layer 12.

Figure 4:
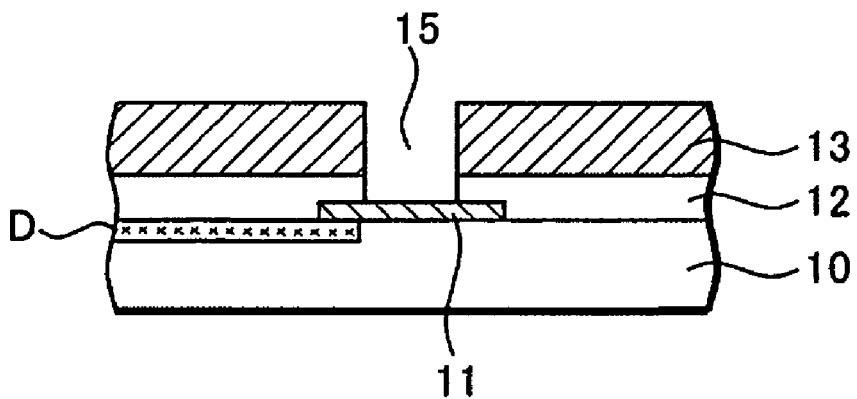
FIG. 4 is a cross-sectional view for explaining the manufacturing method of the semiconductor device of the first embodiment of the invention.

Next, as shown in FIG. 4, the resin layer 12 exposed in the opening of the support body 13 is selectively removed. By selectively removing the resin layer 12, an opening 15 is formed penetrating the supporting member 13 and the resin layer 12. By this process, the pad electrode 11 is exposed at a bottom of the opening 15.

It is preferable that the process of selectively removing the resin layer 12 is performed by dip etching using an organic solution as an etchant. The etching can be performed after the resist layer 14 is removed, but the resist layer 14 can remain and be used as a mask for the etching. When the resist layer 14 is used as a mask, the resist layer 14 is removed after the etching. Instead of by dip etching, the process of selectively removing the resin layer 12 can be performed by wet etching or dry etching. Alternatively, this process can be performed by so-called ashing. By selectively removing the resin layer 12, the opening 15 exposing the pad electrode 11 is formed through the supporting member 13 and the resin layer 12.

The process of removing the supporting member 13 and the resin layer 12 in the position corresponding to the pad electrode 11 can be performed by etching at a time. In this case, wet etching or dry etching is performed to the supporting member 13 and the resin layer 12 with a predetermined etchant or etching gas using the resist layer 14 as a mask.

Figure 5:
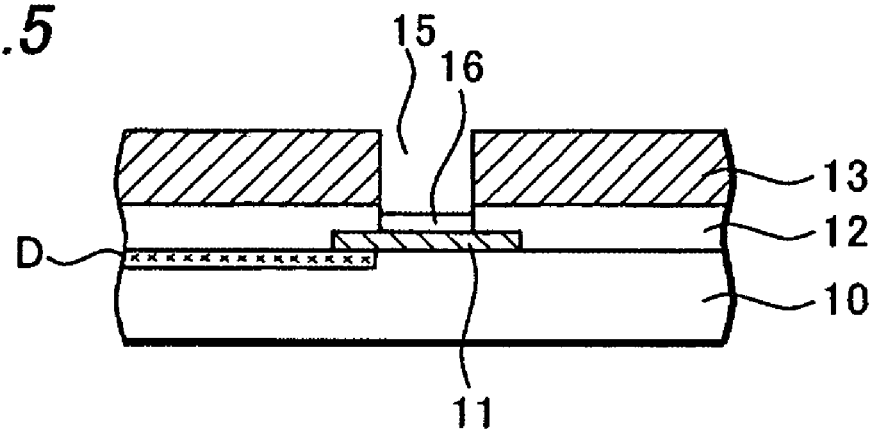
FIG. 5 is a cross-sectional view for explaining the manufacturing method of the semiconductor device of the first embodiment of the invention.

Next, as shown in FIG. 5, a metal layer 16 is formed on the pad electrode 11 exposed at the bottom of the opening 15. It is preferable that the metal layer 16 is made of nickel (Ni), gold (Au), or a compound of these. Alternatively, the metal layer 16 can be formed of other metal than these.

Figure 6:
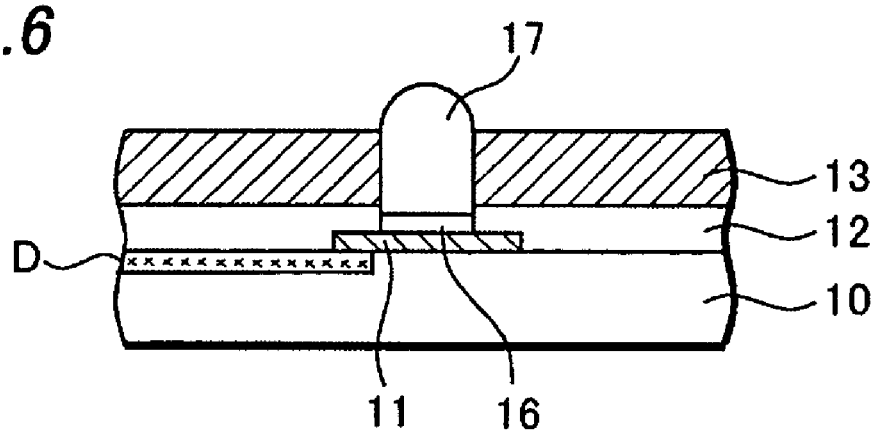
FIG. 6 is a cross-sectional view for explaining the manufacturing method of the semiconductor device of the first embodiment of the invention.
Figure 7:
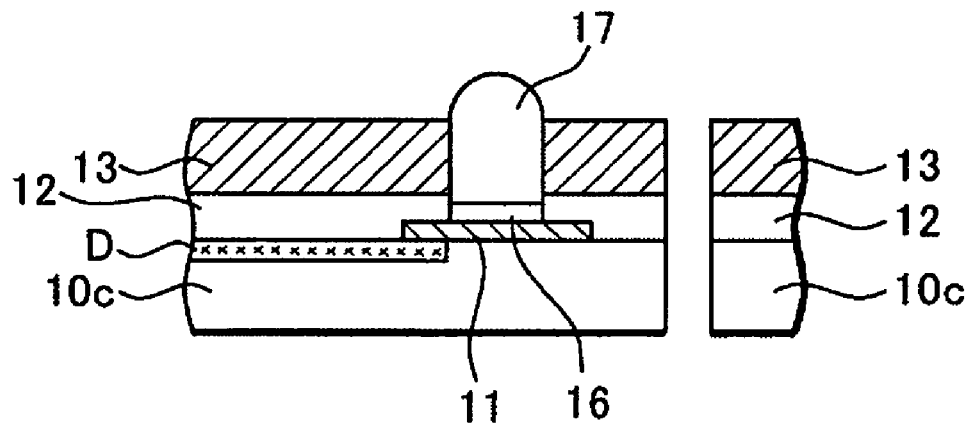
FIG. 7 is a cross-sectional view for explaining the semiconductor device and the manufacturing method thereof of the first embodiment of the invention.

Next, a conductive terminal 17 is formed on the metal layer 16 as shown in FIG. 6. The conductive terminal 17 is formed protruding from the top surface of the supporting member 13. Alternatively, the conductive terminal 17 can be formed so as to form the top surface of the supporting member 13 without protruding from there. It is noted that the conductive terminal 17 can be omitted. In this case, the metal layer 16 is exposed in the opening 15.

Finally, the semiconductor substrate 10 is separated into semiconductor dice 10c along a dicing line (not shown) as shown in FIG. 7. Thus, the semiconductor device of the first embodiment is completed. The completed semiconductor device is mounted on a circuit board (not shown) where an external electrode (not shown) is patterned. In this process, the external electrode (not shown) of the circuit board is electrically connected with the conductive terminal 17. When the conductive terminal 17 is not formed, the external electrode (not shown) is electrically connected with the metal layer 16.

As described above, in the semiconductor device of the first embodiment, the top surface of the semiconductor die 10c is protected from mechanical damage or moisture by the supporting member 13, and the pad electrode 11 and the circuit board can be electrically connected with each other through the opening 15 penetrating the supporting member 13 on the top surface of the die 10c. This simplifies a structure and a manufacturing process of the semiconductor device, and improves its reliability compared with a conventional semiconductor device having a complex structure. That is, the reliability of the semiconductor device can be improved without increasing a manufacturing cost.

Figure 8:
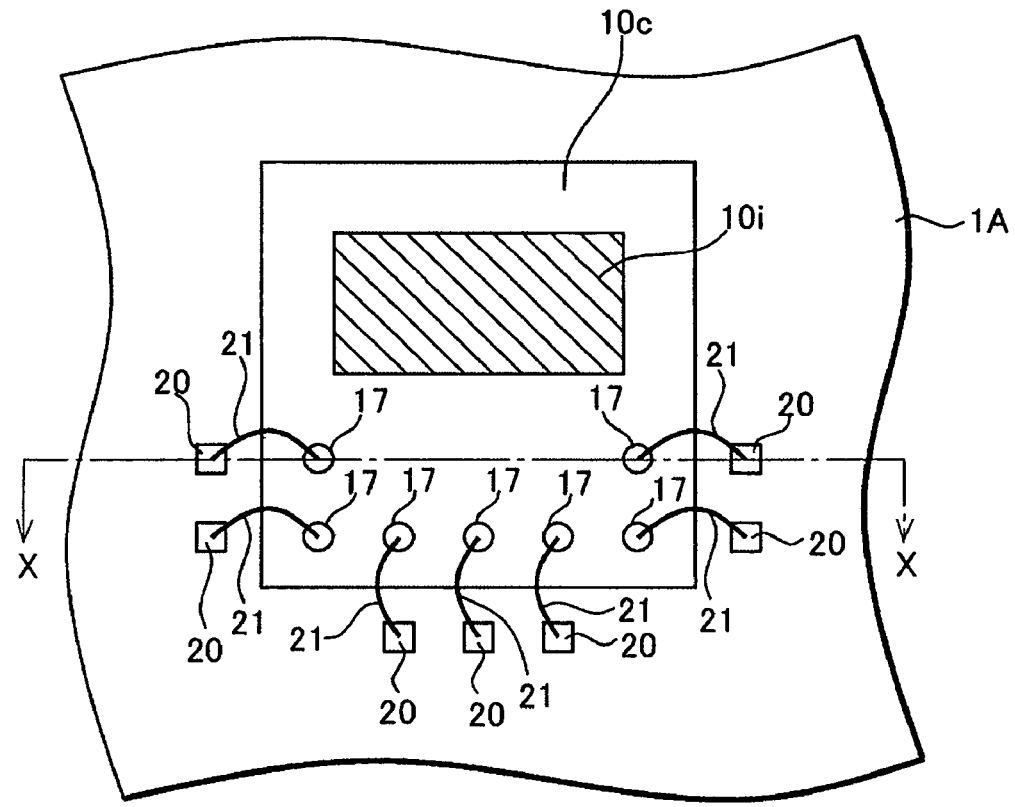
FIG. 8 is a top view for explaining the semiconductor device of the first embodiment of the invention.
Figure 9:
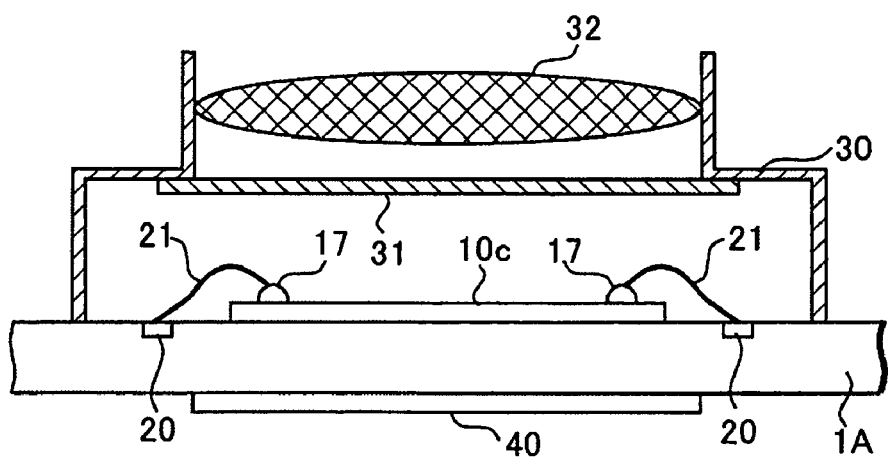
FIG. 9 is a cross-sectional view along line X-X of FIG. 8.

Next, the semiconductor device of the embodiment that is mounted on the circuit board will be described with reference to drawings. FIG. 8 is a top view for explaining the semiconductor device of the embodiment. FIG. 9 is a cross-sectional view along line X-X of FIG. 8. In FIG. 8, components are omitted except the circuit board 1A, the semiconductor die 10c, and components used for connecting the board 1A and the die 10c.

The semiconductor die 10c is mounted on the circuit board 1A such as a printed circuit board as shown in FIG. 8. External electrodes 20 are patterned on the circuit board 1A. The pattern of the external electrodes 20 is simply shown in FIGS. 8 and 9.

The semiconductor die 10c is mounted on the circuit board 1A in such a manner that its surface where the supporting member 13 is not formed, i.e., the bottom surface faces the circuit board 1A. A light receiving region 10i of the top surface of the semiconductor die 10c is formed with the electronic devices D as the light receiving elements such as CCDs. In a region except the light receiving region 10i on the top surface of the semiconductor die 10c, the conductive terminals 17 formed in the openings 15 are exposed. Alternatively, when the conductive terminals 17 are not formed, the metal layers 16 are exposed there.

The conductive terminals 17 of the semiconductor die 10c and the external electrodes 20 of the circuit board 1A are connected with each other through, for example, bonding wire 21. Alternatively, a flexible sheet or tape (not shown) formed with a conductive pattern can be used instead of the bonding wire 21. When the conductive terminals 17 are not formed, the metal layers 16 and the external electrodes 20 of the circuit board 1A are connected with each other through, for example, the bonding wire 21.

Furthermore, on a surface of the circuit board 1A where the semiconductor die 10c is mounted, i.e., on a top surface, a rack portion 30 is formed covering the semiconductor die 10c. An opening for letting in light from outside is formed in the rack portion 30 in a position above the light receiving region 10i of the semiconductor die 10c. In this opening, a lens 32 is provided for focusing light from outside on the light receiving region 10i through a filter 31 which transmits predetermined wavelengths. The semiconductor die 10c, the rack portion 30, the filter 31, the lens 32, and so on form a so-called camera module. The bottom surface of the semiconductor die 10c facing the circuit board 1A is not formed with protruding conductive terminals as has been seen in a conventional semiconductor device, so that slanting or missetting of the semiconductor die 10c can be minimized. Therefore, it is prevented that a blur occurs in an image taken by the electronic devices D by slanting or missetting of the die.

On a surface of the circuit board 1A where the semiconductor die 10c is not formed, i.e., on a bottom surface, a DSP (Digital Signal Processor) die 40 for processing an image signal from the CCD as the electronic device D can be mounted. This can minimize an area of the circuit board 1A for mounting the semiconductor die 10c and the DSP die 40.

Figure 10:
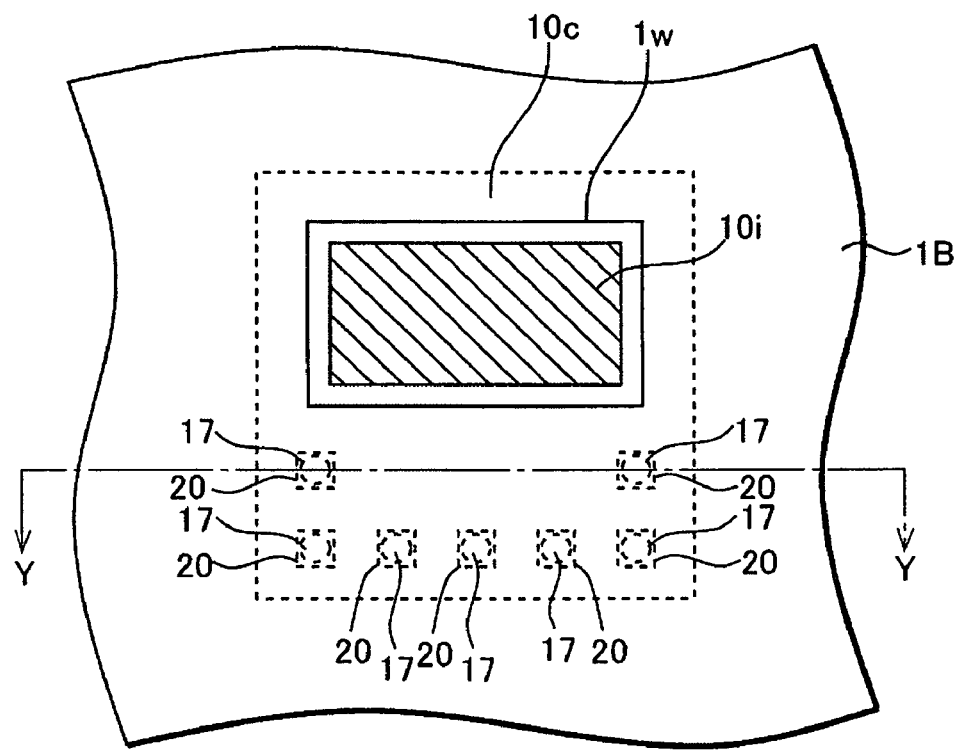
FIG. 10 is a top view for explaining the semiconductor device of the first embodiment of the invention.
Figure 11:
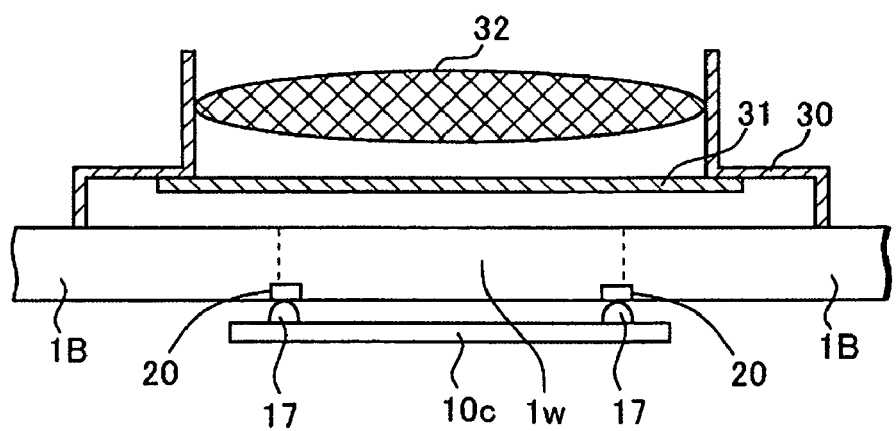
FIG. 11 is a cross-sectional view along line Y-Y of FIG. 10.

The semiconductor device of the embodiment can also be mounted on the circuit board in a manner shown in FIGS. 10 and 11. FIG. 10 is a top view for explaining the semiconductor device of the embodiment. FIG. 10 is a top view showing the surface of the circuit where light enters from outside, i.e., the top surface. FIG. 11 is a cross-sectional view along line Y-Y of FIG. 10. In FIGS. 10 and 11, same components as those of FIGS. 8 and 9 are provided with same numerals and the description thereof is omitted. In FIG. 10, components are omitted except a circuit board 1B, the semiconductor die 10c, and components used for connecting the board 1B and the die 10c.

The circuit board 1B such as a printed circuit board is provided with a light receiving window 1w as an opening as shown in FIG. 10. The external electrodes 20 are patterned on a surface of the circuit board 1B where light from outside does not reach, i.e., on a bottom surface thereof. The pattern of the external electrodes 20 is simply shown in FIGS. 10 and 11.

The semiconductor die 10c is mounted on the bottom surface of the circuit board 1B. The semiconductor die 10c is mounted on the circuit board 1B in such a manner that its surface where the supporting member 13 is formed, i.e., the top surface faces the bottom surface of the circuit board 1B. The conductive terminals 17 of the semiconductor die 10c are directly connected with the external electrodes 20 of the circuit board 1B.

The semiconductor die 10c mounted on the circuit board 1B exposes its light receiving region 10i from the light receiving window 1w of the circuit board 1B. With this structure, light from outside can enter the light receiving region 10i through the light receiving window 1w although the semiconductor die 10c is mounted on the bottom surface of the circuit board 1B.

Furthermore, on a surface of the circuit board 1B where the semiconductor die 10c is not mounted, i.e., on a top surface, the rack portion 30 is formed covering the semiconductor die 10c as shown in FIG. 11. An opening for letting in light from outside is formed in the rack portion 30 in a position above the light receiving region 10i of the semiconductor die 10c. In this opening, the lens 32 is provided for focusing light from outside on the light receiving region 10i through the filter 31 which transmits predetermined wavelengths.

A focal length from the lens 32 to the light receiving region 10i of the semiconductor die 10c need have a predetermined amount corresponding to performance of the lens 32. Therefore, when the focal length need be set large, this has caused a large thickness of the camera module (i.e., a large height of the rack portion 30) including the lens 32 and the semiconductor die 10c. In this embodiment shown in FIG. 11, however, since light is led to the light receiving region 10i of the semiconductor die 10c through the light receiving window 10w of the circuit board 1B, the thickness of the circuit board 1B forms a part of the focal length. Therefore, the camera module can be thinned by an amount of the thickness of the circuit board 1B.

Figure 12:
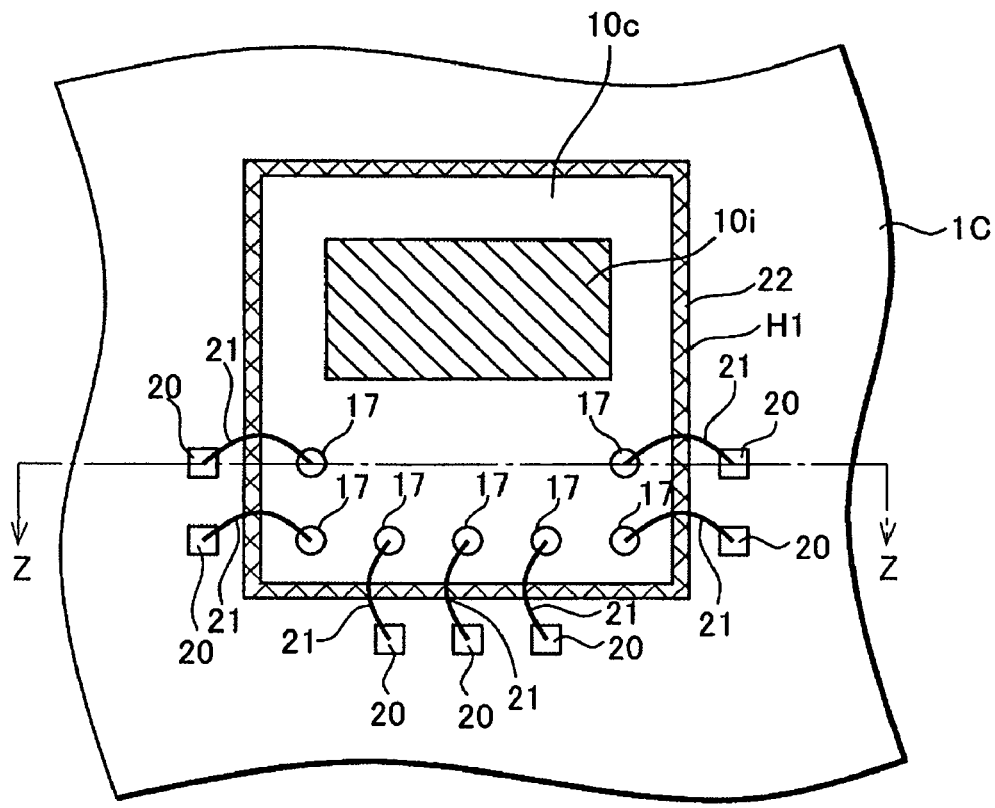
FIG. 12 is a top view for explaining the semiconductor device of the first embodiment of the invention.
Figure 13:
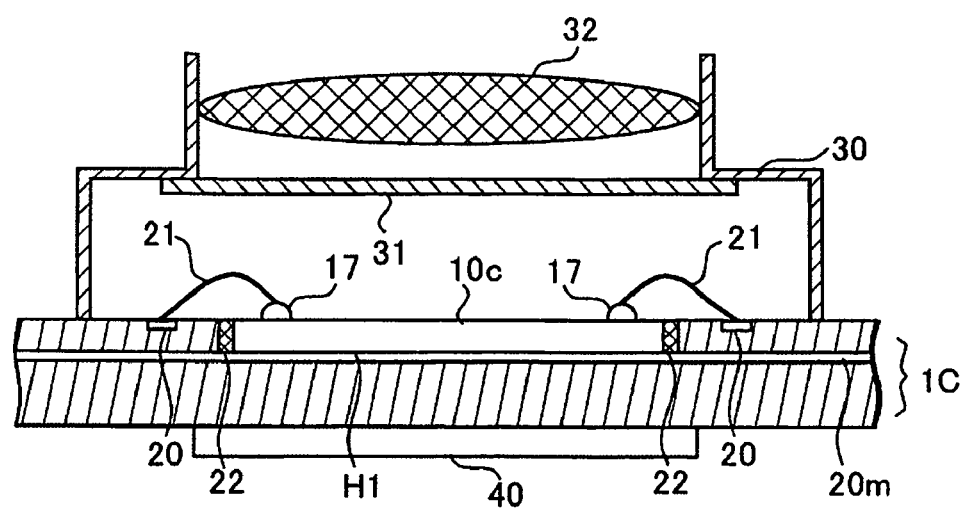
FIG. 13 is a cross-sectional view along line Z-Z of FIG. 18.
Figure 14:
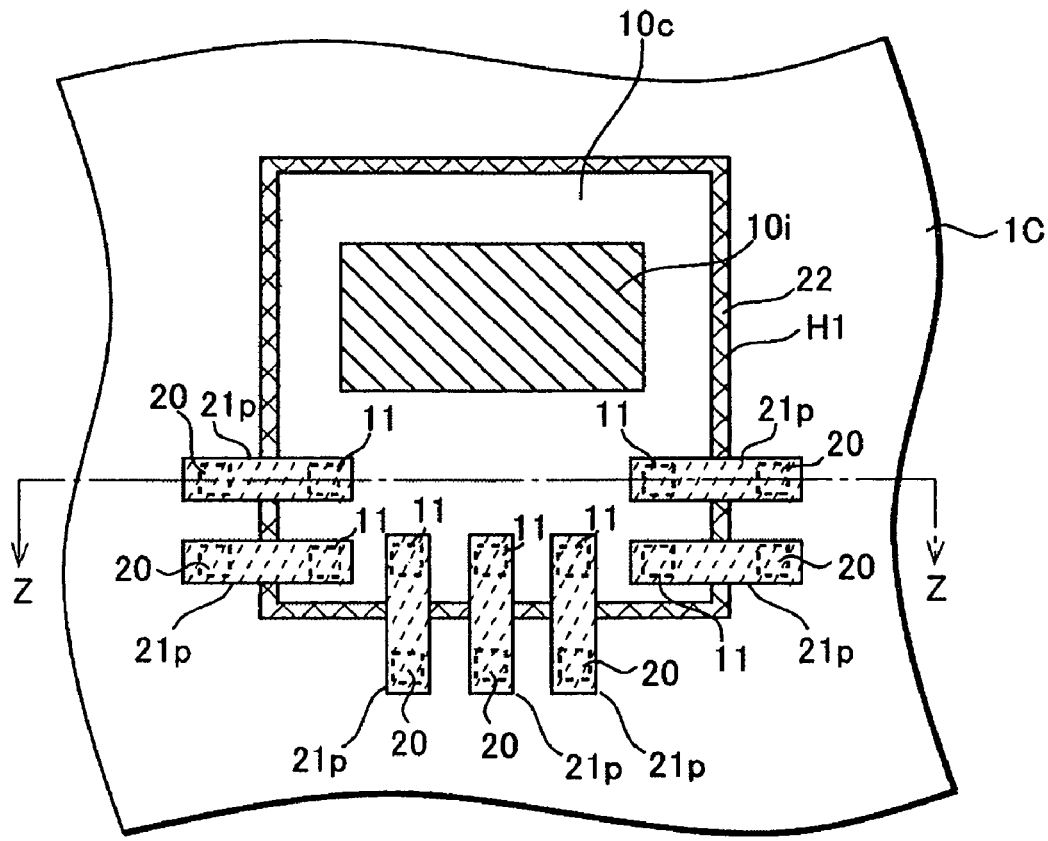
FIG. 14 is a top view for explaining the semiconductor device of the first embodiment of the invention.
Figure 15:
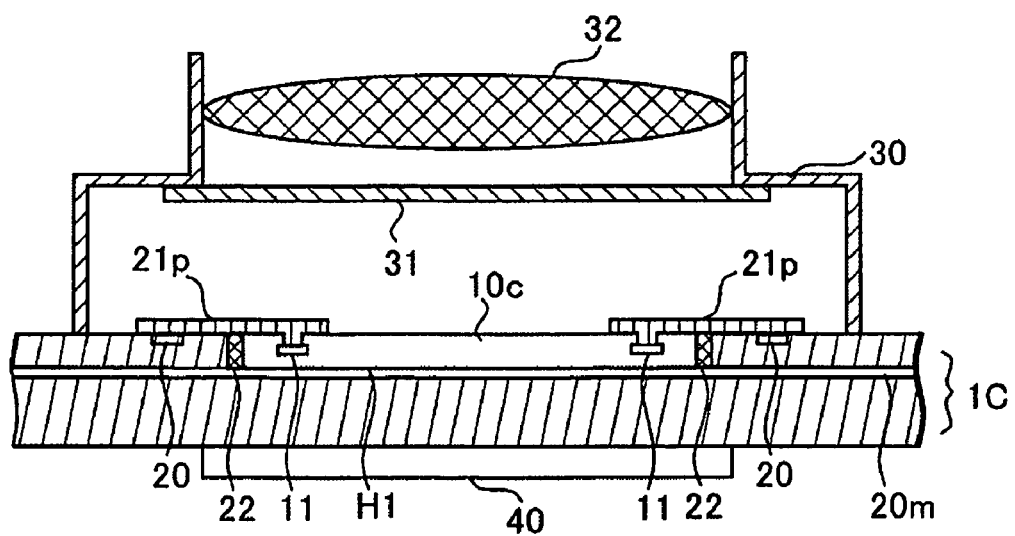
FIG. 15 is a cross-sectional view along line Z-Z of FIG. 20.
Figure 16:
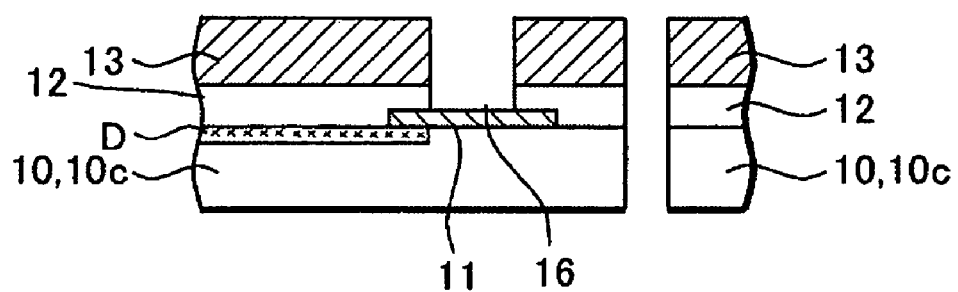
FIG. 16 is a cross-sectional view for explaining the manufacturing method of the semiconductor device of the first embodiment of the invention.
Figure 17:
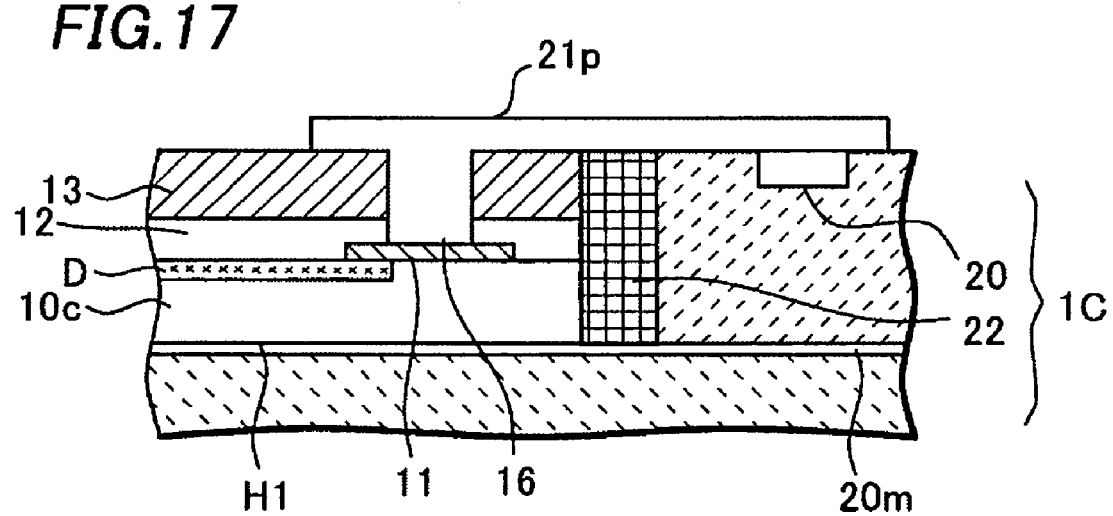
FIG. 17 is a cross-sectional view for explaining the manufacturing method of the semiconductor device of the first embodiment of the invention.
Figure 18:
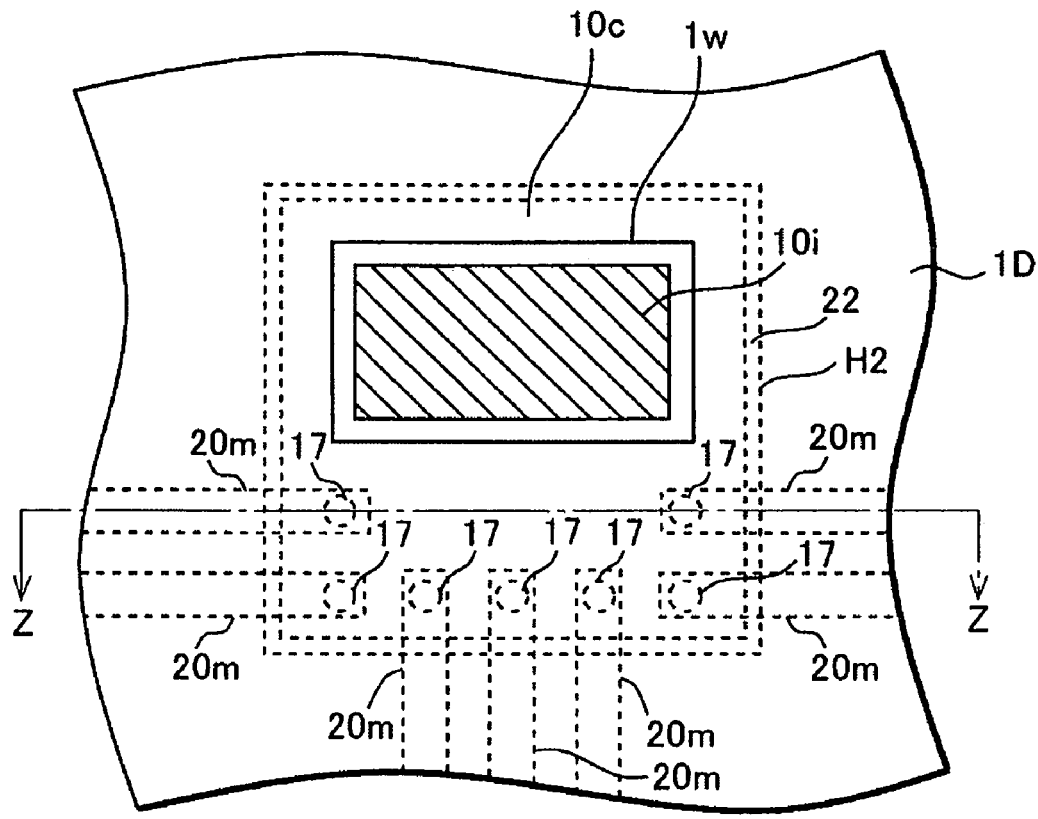
FIG. 18 is a top view for explaining the semiconductor device of the first embodiment of the invention.
Figure 19:
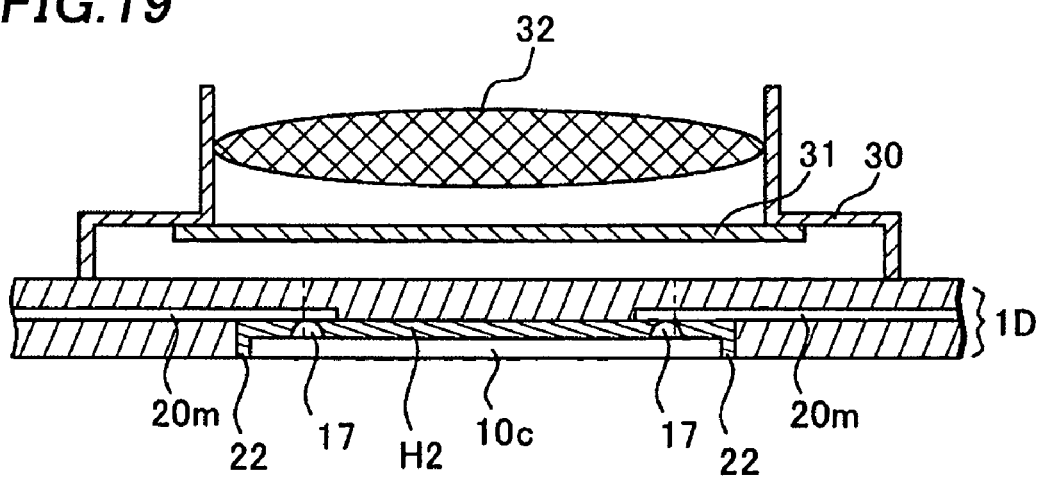
FIG. 19 is a cross-sectional view along line Z-Z of FIG. 24.

The semiconductor device can be mounted on the circuit board in such a manner that the semiconductor device is embedded in a concave portion formed in the circuit board. This case will be described with reference to drawings. FIGS. 12, 14, and 18 are top views for explaining the semiconductor device of this embodiment. FIGS. 13, 15, and 19 are cross-sectional views along line Z-Z of FIGS. 12, 14, and 18, respectively. FIGS. 16 and 17 are cross-sectional views for explaining the manufacturing method of the semiconductor device shown in FIGS. 14 and 15.

There is formed in the circuit board 1C a Cu layer 20m as a metal layer for an external electrode having a predetermined pattern, being laminated with a predetermined resin layer, as shown in FIGS. 12 and 13. On a top surface of the circuit board 1C (the side facing the lens 32), a concave portion H1 is formed having such size that the concave portion H1 can house all of the semiconductor die 10c and the layers laminated thereon. Although a method of forming the concave portion H1 is not particularly limited, the concave portion H1 is formed by etching the circuit board 1C by laser irradiation at a predetermined output or cutting the circuit board 1C with a drill, for example.

At a bottom of the concave portion H1, the Cu layer 20m can be partially exposed as shown in FIG. 13, or the resin layer can be exposed. It is noted that the Cu layer 20m in this case is not the external electrode for electrically connecting with the electronic devices D mounted on the circuit board 1C. Although not limited particularly, this Cu layer 20m is patterned to form a shape like an island covering all the surface of the semiconductor die 10c, and a part of the Cu layer 20m extends to edges of the circuit board 1C and is exposed at sides of the circuit board 1C.

The semiconductor die 10c is mounted in the concave portion H1 in such a manner that the bottom of the concave portion H1 and the bottom surface of the die 10c face each other. When there is a space between sidewalls of the concave portion H1 and the semiconductor die 10c, the space is filled with an organic material such as epoxy resin used in the manufacturing process of the semiconductor device, that is, with an under filler 22.

Then, the conductive terminals 17 of the semiconductor die 10c are connected with the external electrodes 20 of the circuit board 1C through, for example, the bonding wire 21. When the conductive terminals 17 are not formed in the semiconductor die 10c, the metal layers 16 or the pad electrodes 11 in the opening 15 are connected with the external electrodes 20 through the bonding wire 21.

In the embodiment, the pad electrodes 11 of the semiconductor die 10c mounted in the concave portion H1 and the external electrodes 20 of the circuit board 1C can be connected with each other through wiring formed by printing a predetermined pattern of conductive paste 21p containing silver particles (Ag) for example, as shown in FIGS. 14 and 15. In this case, the semiconductor substrate 10 and layers laminated thereon are separated in a plurality of semiconductor dice 10c by dicing after the openings 15 are formed, as shown in FIG. 16. Then, the semiconductor die 10c is mounted in the concave portion H1 of the circuit board 1C in such a manner that the bottom of the concave portion H1 and the bottom surface of the die 10c face each other, as shown in FIG. 17.

Then, when there is a space between side walls of the concave portion H1 and the semiconductor die 10c, the space is filled with the under filler 22. Then, the predetermined pattern of conductive paste 21p is printed so as to extend from the inside of the opening 15 onto the external electrode 20 of the circuit board 1C, being connected with the pad electrode 11. The conductive paste 21p is formed to have a film thickness of, for example, about 100 μm except at the opening 15.

Accordingly, when the semiconductor die 10c is mounted in the concave portion H1 of the circuit board 1C, the length from the lens 32 to the light receiving region 10i of the semiconductor die 10c is increased compared with when the semiconductor die 10c is mounted on the top surface of the circuit board 1C. Therefore, the thickness of the camera module including the lens 32 and the semiconductor die 10c (i.e. the height of the rack portion 30) can be reduced by an increased amount of the length, that is, at least by an amount of the thickness of the semiconductor die 10c.

For example, when all the thickness of the semiconductor die 10c and the layers laminated thereon is about 0.85 to 1 mm, and the focal length from the lens 32 to the light receiving region 10i of the semiconductor die 10c is 6 to 7 mm, the thickness of the camera module (i.e., the height of the rack portion 30) can be reduced by one sixth of the focal length.

When the Cu layer 20m is exposed at the bottom of the concave portion H1, since the exposed Cu layer 20m and the bottom surface of the semiconductor die 10c are in contact with each other, heat generated when the semiconductor die 10c is operated is easily released to outside through the Cu layer 20m. This can minimize degradation of performance of the light receiving elements such as CCDs of which the electric performance is easy to be degraded by heat.

In this case, the Cu layer 20m and the bottom surface of the semiconductor die 10c are not necessarily in direct contact with each other. For example, it is possible that an insulation film (not shown) made of a silicon oxide film or a silicon nitride film is formed on the bottom surface of the semiconductor die 10c, and the bottom surface of the semiconductor die 10c and the Cu layer 20m are connected with each other with the insulation film therebetween. Furthermore, when the Cu layer 20m is not exposed at the bottom of the concave portion H1, it is possible that the semiconductor die 10c is mounted in such a manner that its bottom surface and the resin layer at the bottom of the concave portion H1 are connected with each other.

As another mounting method, the semiconductor device of the embodiment can be embedded in a concave portion formed on the bottom surface (i.e., the side not facing the lens 32) of the circuit board.

In detail, for example, the Cu layer 20m is laminated in a circuit board 1D, as a metal layer for an external electrode having a predetermined pattern, as shown in FIGS. 18 and 19. In one region of the circuit board 1D, the light receiving window 1w as an opening is formed having the same size or almost the same size as the light receiving region 10i of the semiconductor die 10c. Furthermore, on the bottom surface of the circuit board 1D under the light receiving window 1w, a concave portion H2 is formed to cover the light receiving window 1w, having such size that the concave portion H2 can house all of the semiconductor die 10c and the layers laminated thereon. At a bottom of the concave portion H2, the Cu layer 20m is exposed. Although a method of forming the concave portion H2 is not particularly limited, the concave portion H2 is formed by etching the circuit board 1D by laser irradiation at a predetermined output or cutting the circuit board 1D with a drill, for example.

The semiconductor die 10c is mounted in the concave portion H2 in such a manner that the bottom of the concave portion H2 and the top surface of the semiconductor die 10c face each other and the conductive terminals 17 and the Cu layer 20m are connected with conductive paste (not shown) therebetween. When there is a space between side walls of the concave portion H2 and the semiconductor die 10c, the space is filled with an organic material such as epoxy resin used in the manufacturing process of the semiconductor device, that is, the under filler 22.

In this case, too, the length from the lens 32 to the light receiving region 10i of the semiconductor die 10c is increased compared with when the semiconductor die 10c is mounted on the top surface of the circuit board. Furthermore, the length is increased by an amount of the thickness of the circuit board 1D on the bottom of the concave portion H2, compared with when the semiconductor die 10c is mounted in the concave portion H1 formed on the top surface of the circuit board 1C. Accordingly, the thickness of the camera module including the lens 32 and the semiconductor die 10c (i.e. the height of the rack portion 30) can be reduced by an increased amount of the length.

Figure 20:
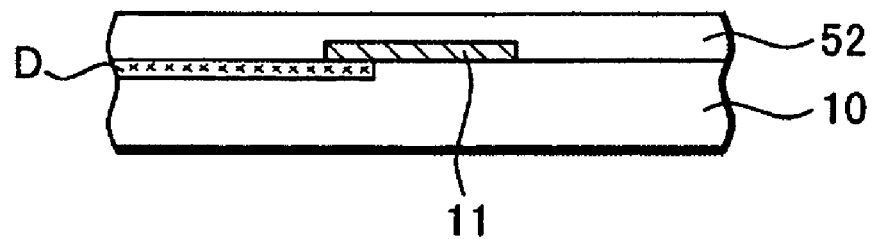
FIG. 20 is a cross-sectional view for explaining a manufacturing method of a semiconductor device of a second embodiment of the invention.
Figure 21:
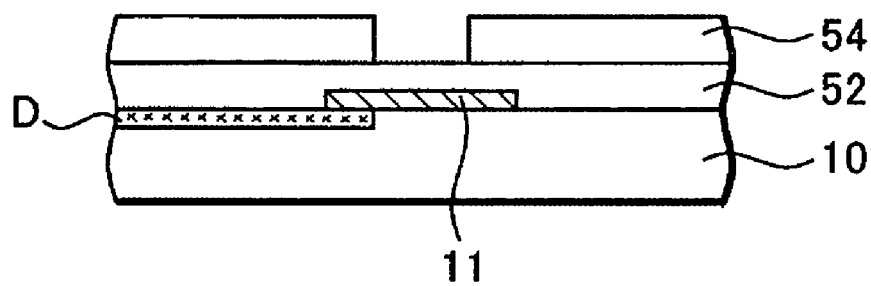
FIG. 21 is a cross-sectional view for explaining the manufacturing method of the semiconductor device of the second embodiment of the invention.
Figure 22:
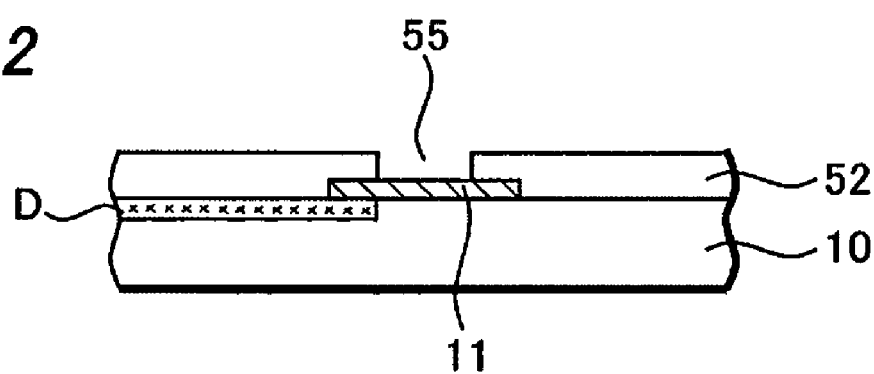
FIG. 22 is a cross-sectional view for explaining the manufacturing method of the semiconductor device of the second embodiment of the invention.

Next, a semiconductor device of a second embodiment of the invention will be described with reference to drawings. A manufacturing method of the semiconductor device of the second embodiment is as follows. FIGS. 20 to 22 are cross-sectional views for explaining the manufacturing method of the semiconductor device of this embodiment. FIGS. 20 to 22 show a cross-section of a semiconductor substrate 10 near a border of adjacent dice (i.e. near a dicing line (not shown)) to be separated in a dicing process which will be described below. An electronic device D is formed on a top surface of the semiconductor substrate 10 in FIGS. 20 to 22. It is noted that any number of the electronic devices D can be formed thereon. Suppose that the electronic device D is a light receiving element such as CCD or other electronic device D than the light receiving element.

First, as shown in FIG. 20, a pad electrode 11 is formed on the top surface of the semiconductor substrate 10 with an interlayer insulation film (not shown) (e.g. made of BPSG) therebetween. The semiconductor substrate 10 and the pad electrode 11 have the same structure as the semiconductor substrate 10 and the pad electrode 11 of the first embodiment. On the semiconductor substrate 10 including the pad electrode 11, a passivation film (not shown) is formed, which is made of a silicon oxide film or a silicon nitride film, exposing a part of the pad electrode 11.

Then, a resin layer 52 made of, for example, epoxy resin is coated on the top surface of the semiconductor substrate 10 including the pad electrode 11. This resin layer 52 has a function of supporting and protecting the semiconductor substrate 10.

When the electronic device D is the light receiving element such as CCD, it is preferable that the resin layer 52 is made of a transparent or semitransparent material and the thickness is about 20 to 30 μm.

Next, a back-grinding process is performed to the semiconductor substrate 10 according to needs. Then, the bottom surface of the semiconductor substrate 10 is etched using acid (e.g. mixed solution of HF and nitric acid) as an etchant. By this process, a mechanically damaged layer of the semiconductor substrate 10 occurred by the back-grinding process is removed, and performance of the electronic device D formed on the top surface of the semiconductor substrate 10 is improved.

Next, as shown in FIG. 21, a resist layer 54 is selectively formed on a top surface of the resin layer 52. That is, the resist layer 54 is formed having an opening in a position corresponding to the pad electrode 11.

Next, as shown in FIG. 22, the resin layer 52 is selectively removed. It is preferable that the process of selectively removing the resin layer 52 is performed by dry etching or wet etching, for example. The etching can be performed using the resist layer 54 as a mask, but it is possible to perform the etching with the resist layer 54 removed. When the resist layer 54 is used as a mask for the etching, the resist layer 54 is removed after the etching. By selectively removing the resin layer 52, an opening 55 is formed penetrating the resin layer 52. By this process, the pad electrode 11 is exposed at the bottom of the opening 55.

Although not shown, a metal layer 16, which is the same layer as that of the first embodiment, is formed on the pad electrode 11 exposed in the opening 55. Furthermore, a conductive terminal 17, which is the same layer as that of the first embodiment, can be formed on the metal layer 16.

Finally, the semiconductor substrate 10 is separated into semiconductor dice 10c along a dicing line (not shown). Thus, the semiconductor device of the second embodiment is completed. The completed semiconductor device is mounted on a circuit board (not shown) where an external electrode (not shown) is patterned. The mounting method is the same as that of the first embodiment. It is noted that when the electronic device D formed on the top surface of the semiconductor die 10c is not the light receiving element, the light receiving window 1w need not be formed in the circuit board, unlike the circuit board 1B in the first embodiment.

As described above, in the semiconductor device of the second embodiment, the pad electrode 11 and the circuit board can be electrically connected with each other through the opening 55 penetrating the resin layer 52 in the top surface of the semiconductor device. This simplifies the structure and the manufacturing process of the semiconductor device, and improves its reliability compared with a conventional semiconductor device having a complex structure. That is, the reliability of the semiconductor device can be improved without increasing a manufacturing cost.

Figure 23:
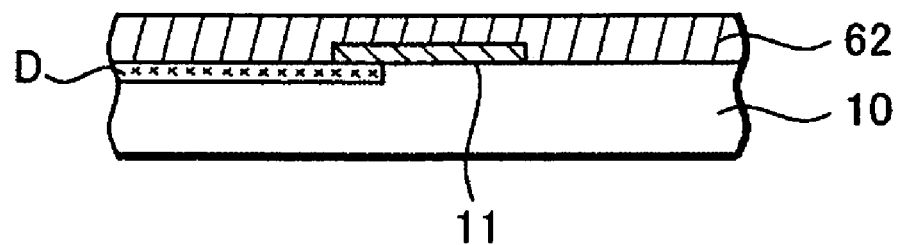
FIG. 23 is a cross-sectional view for explaining a manufacturing method of a semiconductor device of a third embodiment of the invention.
Figure 24:
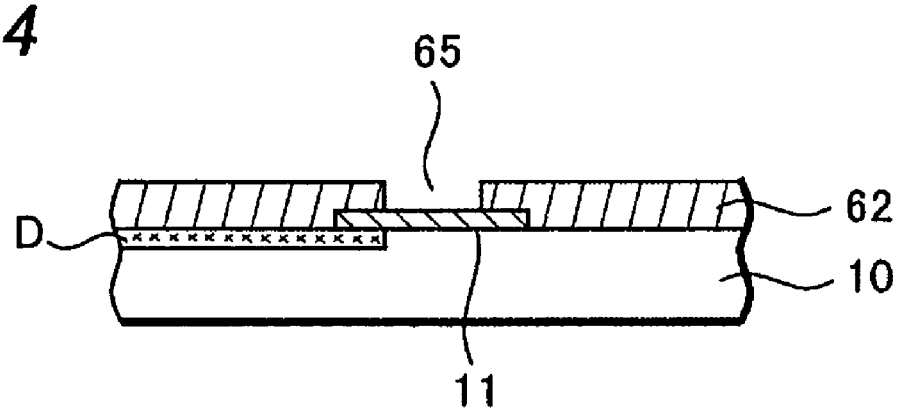
FIG. 24 is a cross-sectional view for explaining the manufacturing method of the semiconductor device of the third embodiment of the invention.

A semiconductor device of a third embodiment of the invention will be described with reference to drawings. A manufacturing method of the semiconductor device of the third embodiment is as follows. FIGS. 23 to 24 are cross-sectional views for explaining the manufacturing method of the semiconductor device of this embodiment. FIGS. 23 to 24 show a cross-section of a semiconductor substrate 10 near a border of adjacent dice (i.e. near a dicing line (not shown)) to be separated in a dicing process which will be described below. An electronic device D is formed on a top surface of the semiconductor substrate 10 in FIGS. 23 to 24. It is noted that any number of the electronic devices D can be formed thereon. Suppose that the electronic device D is the one except a light receiving element such as CCD.

First, as shown in FIG. 23, a pad electrode 11 is formed on a top surface of the semiconductor substrate 10 with an interlayer insulation film (not shown) (e.g. made of BPSG) therebetween. The semiconductor substrate 10 and the pad electrode 11 have the same structure as the semiconductor substrate 10 and the pad electrode 11 of the first embodiment. On the semiconductor substrate 10 including the pad electrode 11, a passivation film (not shown) is formed, which is made of a silicon oxide film or a silicon nitride film, exposing a part of the pad electrode 11.

Then, a photosensitive resist layer 62 made of, for example, a photosensitive material is formed on the top surface of the semiconductor substrate 10 including the pad electrode 11. This photosensitive resist layer 62 has a function of supporting and protecting the semiconductor substrate 10.

Next, a back-grinding process is performed to the semiconductor substrate 10 according to needs. Then, the bottom surface of the semiconductor substrate 10 is etched using acid (e.g. mixed solution of HF and nitric acid) as an etchant.

Then, an opening 65 is formed in a part of the photosensitive resist layer 62 by exposure and development with a mask as shown in FIG. 24. This opening 65 is formed in a position corresponding to the pad electrode 11 in the photosensitive resist layer 62. The pad electrode 11 is exposed at a bottom of the opening 65.

Although not shown, a metal layer 16, which is the same layer as that of the first embodiment, is formed on the pad electrode 11 exposed in the opening 65. Furthermore, a conductive terminal 17, which is the same layer as that of the first embodiment, can be formed on the metal layer 16. Finally, the semiconductor substrate 10 is separated into semiconductor dice 10c along a dicing line (not shown). Thus, the semiconductor device of the third embodiment is completed. The completed semiconductor device is mounted on a circuit board (not shown) where an external electrode (not shown) is patterned. The mounting method is the same as that of the first embodiment. It is noted that the light receiving window 1w need not be formed in the circuit board, unlike the circuit board 1B in the first embodiment.

As described above, the pad electrode 11 and the circuit board can be electrically connected with each other through the opening 65 penetrating the photosensitive resist layer 62 in the top surface of the semiconductor device. This simplifies the structure and the manufacturing process of the semiconductor device, and improves its reliability compared with a conventional semiconductor device having a complex structure. That is, the reliability of the semiconductor device can be improved without increasing a manufacturing cost.

Figure 25:
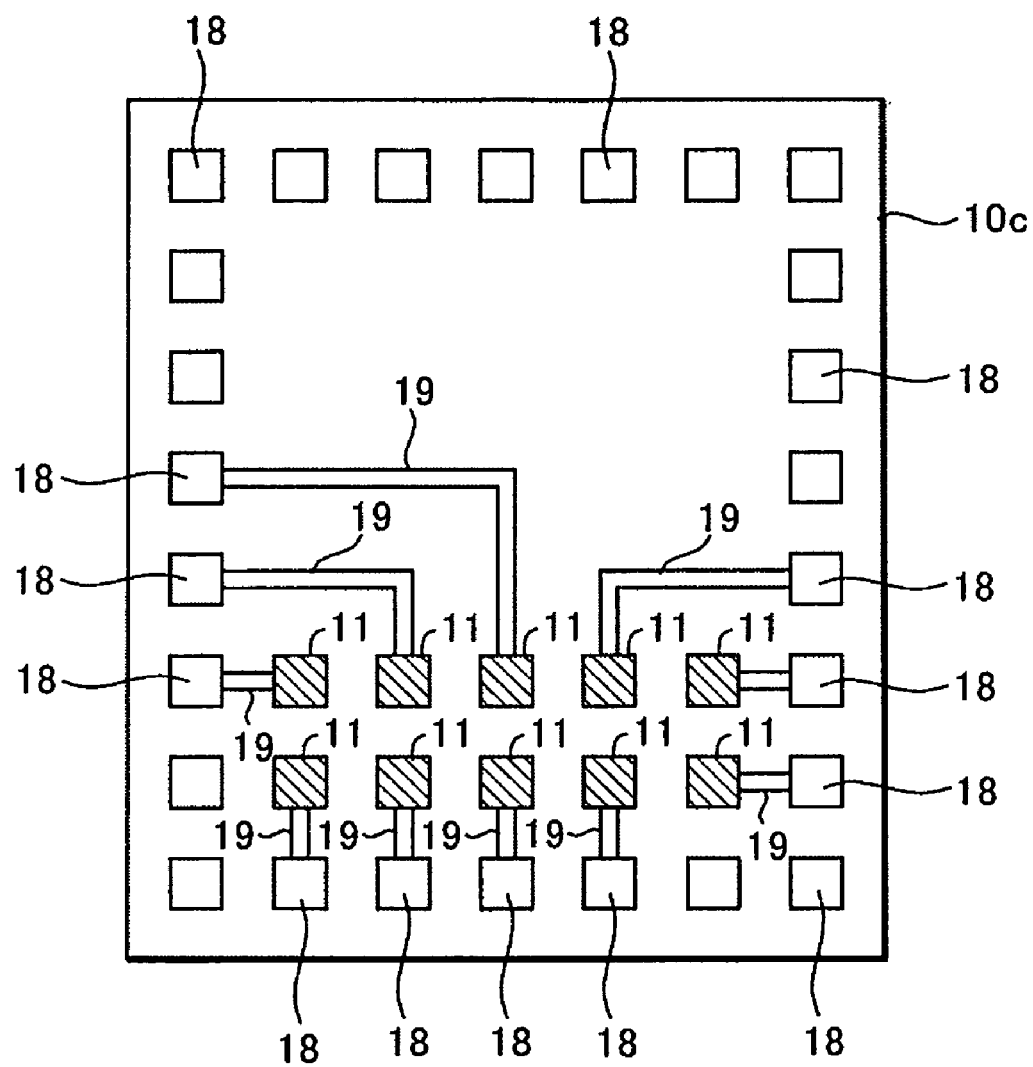
FIG. 25 is a top view for explaining the semiconductor device of the first, second, and third embodiments of the invention.
Figure 26A:
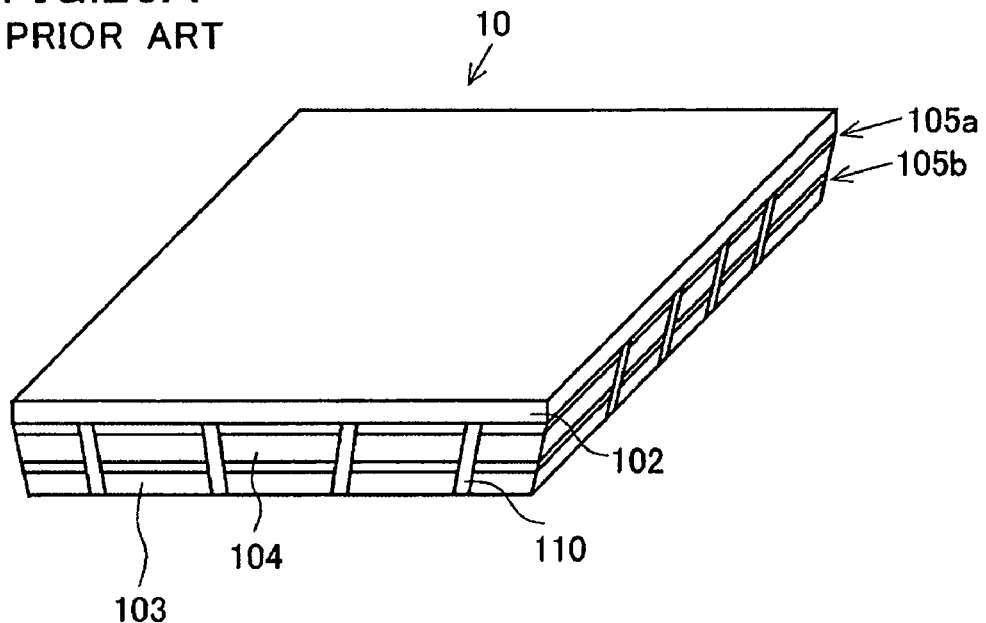
FIGS. 26A and 26B are views for explaining a conventional semiconductor device.
Figure 26B:
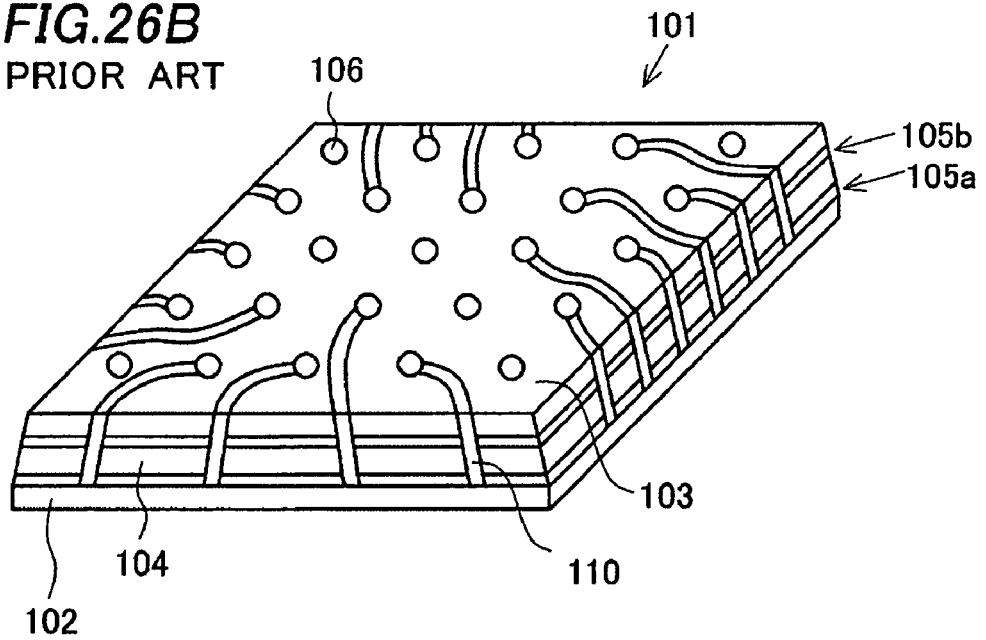
Figure 27:
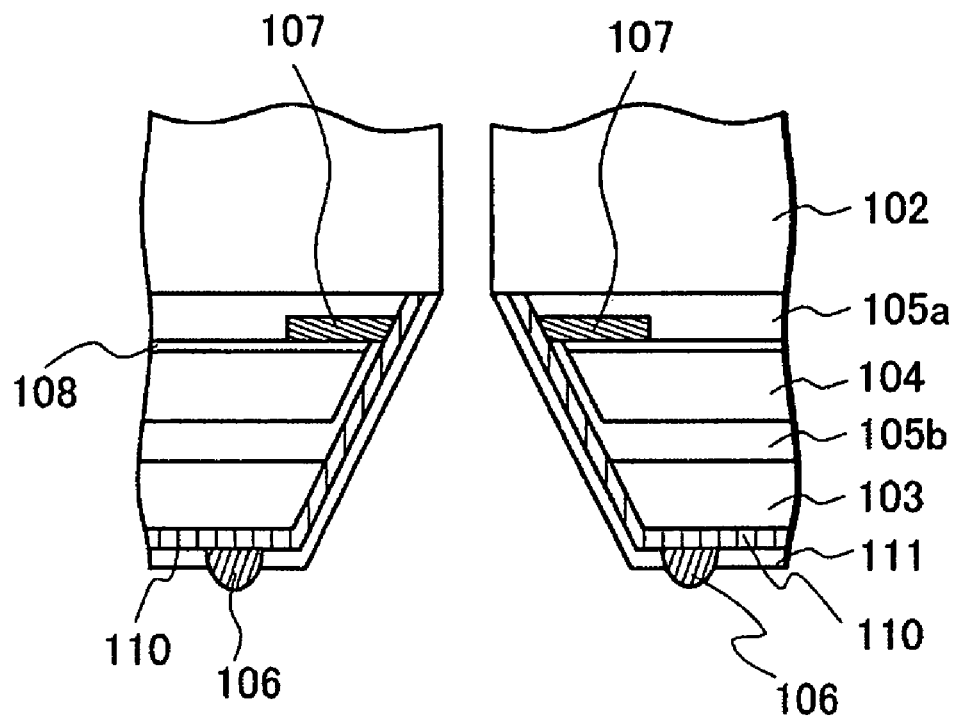
FIG. 27 is a view for explaining the conventional semiconductor device.

In the manufacturing method of the semiconductor device of the first, second, and third embodiments, two types of pad electrodes can be formed on the top surface of the semiconductor substrate 10 in a process of forming the pad electrode, as shown in a top view of FIG. 25. It is noted that FIG. 25 shows only the top surface of the semiconductor die 10c of the completed semiconductor device. In this case, the manufacturing method of the semiconductor device is as follows. For example, although not shown, pad electrodes 11 as first pad electrodes are formed on the top surface of the semiconductor substrate 10 as in the above embodiments, and then pad electrodes for mounting 18 as second pad electrodes are formed along a vicinity of a dicing line. It is preferable that the pad electrodes for mounting 18 are formed at predetermined intervals along the vicinity of the dicing line on the top surface of the semiconductor substrate 10.

Then, wiring layers 19 for electrically connecting the pad electrodes 11 and the pad electrodes for mounting 18 are formed on the top surface of the semiconductor substrate 10. The wiring layers 19 are formed by patterning so as to connect the pad electrodes 11 and the pad electrodes for mounting 18.

Next, the supporting member 13, the resin layer 52, or the photosensitive resist layer 62 are selectively removed to form first openings (i.e., openings 15, 55, or 65) exposing the pad electrodes 11. At the same time (or in a different process), the supporting member 13, the resin layer 52, or the photosensitive resist layer 62 are selectively removed to form second openings (not shown) exposing the pad electrodes for mounting 18. Then, conductive terminals (not shown) are formed on the pad electrodes for mounting 18 exposed in the second openings. At the same time, conductive terminals (not shown)

are formed on the pad electrodes 11, too, according to needs. Finally, the semiconductor substrate 10 is separated into semiconductor dice 10c and the semiconductor devices are completed. In the completed semiconductor device, the pad electrodes for mounting 18 are formed on edges along first and second sides of the top surface of the semiconductor die 10c.

When the semiconductor device is mounted on the circuit board (not shown), the conductive terminals (not shown) formed on the pad electrodes for mounting 18 (i.e. the second pad electrodes) are connected with the external electrodes of the circuit board. On the other hand, the pad electrodes 11 (i.e., the first pad electrodes) or the conductive terminals 17 formed on the pad electrodes 11 are not directly connected with the external electrodes of the circuit board, and can be used as testing electrodes when various tests are performed to the semiconductor device.

In this case, the pad electrodes 11 and the circuit board can be electrically connected with each other through openings (i.e. the second openings) formed in the supporting member 13, the resin layer 52, or the photosensitive resist layer 62 on the pad electrodes for mounting 18. Accordingly, since the edges along the first and second sides of the semiconductor die 10c are equally held on the circuit board, slanting or missetting of the semiconductor device as has been occurring in a mounting operation of the semiconductor device on the circuit board can be minimized. Furthermore, the two types of the pad electrodes can be used for testing and mounting, respectively. This simplifies the structure and the manufacturing process of the semiconductor device, and improves the reliability of the semiconductor device without increasing its manufacturing cost.

What is claimed is:

1. A semiconductor device mounted on a circuit board having an external electrode, comprising:
    a semiconductor die comprising a top surface on which a device element is formed;
    a pad electrode disposed on the top surface; and
    a supporting member disposed on the top surface and having an opening;
    a resin layer bonding the supporting member to the top surface,
    wherein the pad electrode and the external electrode are electrically connected through the opening.

2. The semiconductor device of claim 1, wherein the supporting member is made of a glass, a plastic or silicon.

3. The semiconductor device of claim 2, further comprising a peripheral pad electrode that is disposed on the top surface at a peripheral portion of the semiconductor die, a peripheral conductive terminal that is disposed in another opening of the supporting member formed at the peripheral portion and in electric contact with the peripheral pad electrode, and a wiring layer connecting the pad electrode and the peripheral conductive terminal.

4. The semiconductor device of claim 1, wherein the semiconductor die is mounted on the circuit board so that a bottom surface of the semiconductor die is closer to the circuit board than the top surface, and the pad electrode is electrically connected with an external connection wiring that is physically connected with the external electrode.

5. The semiconductor device of claim 1, further comprising a conductive terminal disposed in the opening and in electric contact with the pad electrode, wherein the semiconductor die is mounted on the circuit board so that the top surface is closer to the circuit board than a bottom surface of the semiconductor die, and the conductive terminal is in contact with the external electrode.

6. The semiconductor device of claim 1, further comprising a peripheral pad electrode that is disposed on the top surface at a peripheral portion of the semiconductor die, a peripheral conductive terminal that is disposed in another opening of the supporting member formed at the peripheral portion and in electric contact with the peripheral pad electrode, and a wiring layer connecting the pad electrode and the peripheral conductive terminal.

7. A semiconductor device mounted on a circuit board having an external electrode, comprising;
    a semiconductor die comprising a top surface on which a device element is formed;
    a pad electrode disposed on the top surface;
    a supporting member disposed on the top surface and having an opening, the pad electrode and the external electrode being electrically connected through the opening; and
    a conductive terminal disposed in the opening so as to be in physical contact with the pad electrode and to protrude from a top surface of the supporting member,
    wherein the semiconductor die is mounted on the circuit board so that a bottom surface of the semiconductor die is closer to the circuit board than the top surface, and the conductive terminal and the external electrode are connected by an external connection wiring.

8. A semiconductor device mounted on a circuit board having an external electrode, comprising:
    a semiconductor die comprising a top surface on which a device element is formed;
    a pad electrode disposed on the top surface;
    a supporting member disposed on the top surface and having an opening, the pad electrode and the external electrode being electrically connected through the opening, and;
    a peripheral pad electrode that is disposed on the top surface at a peripheral portion of the semiconductor die;
    a peripheral conductive terminal that is disposed in another opening of the supporting member formed at the peripheral portion and in electric contact with the peripheral pad electrode; and
    a wiring layer connecting the pad electrode and the peripheral conductive terminal,
    wherein the semiconductor die is mounted on the circuit board so that the top surface is closer to the circuit board than a bottom surface of the semiconductor die, and the peripheral conductive terminal is in contact with the external electrode.

9. The semiconductor device of claim 8, wherein the supporting member is made of a glass, a plastic or silicon.

10. A semiconductor device mounted on a circuit board having an external electrode, comprising:
    a semiconductor die comprising a top surface on which a device element is formed;
    a pad electrode disposed on the top surface;
    a resin layer formed on the top surface and having an opening, the pad electrode and the external electrode being electrically connected through the opening;
    a peripheral pad electrode that is disposed on the top surface at a peripheral portion of the semiconductor die;
    a peripheral conductive terminal that is disposed in another opening of the resin layer formed at the peripheral portion and in electric contact with the peripheral pad electrode; and
    a wiring layer connecting the pad electrode and the peripheral conductive terminal,
    wherein the semiconductor die is mounted on the circuit board so that the top surface is closer to the circuit board than a bottom surface of the semiconductor die, and the peripheral conductive terminal is in contact with the external electrode.

11. The semiconductor device of claim 10, wherein the resin layer is made of a photosensitive resin.

12. A semiconductor device assembly, comprising:
a semiconductor device comprising a semiconductor die comprising a top surface on which a device element is formed, a pad electrode disposed on the top surface, a supporting member disposed on the top surface and having an opening, and a resin layer bonding the supporting member to the top surface, and
a circuit board on which the semiconductor device is mounted, the circuit board comprising an external electrode,
wherein the pad electrode and the external electrode are electrically connected through the opening.

13. The semiconductor device assembly of claim 12, wherein the semiconductor device is disposed in a recess formed in the circuit board.

14. The semiconductor device assembly of claim 13, wherein the supporting member is made of a glass, a plastic or silicon.

15. The semiconductor device assembly of claim 14, further comprising a peripheral pad electrode that is disposed on the top surface at a peripheral portion of the semiconductor die, a peripheral conductive terminal that is disposed in another opening of the supporting member formed at the peripheral portion and in electric contact with the peripheral pad electrode, and a wiring layer connecting the pad electrode and the peripheral conductive terminal.

16. The semiconductor device assembly of claim 13, wherein a bottom surface of the semiconductor die is attached to a bottom of the recess, and the pad electrode is electrically connected with an external connection wiring that is physically connected with the external electrode.

17. The semiconductor device assembly of claim 13, further comprising a conductive terminal disposed in the opening and in electric contact with the pad electrode, wherein a bottom surface of the semiconductor die is attached to a bottom of the recess, and the conductive terminal and the external electrode are connected by an external connection wiring.

18. The semiconductor device assembly of claim 13, further comprising a patterned metal layer embedded in the circuit board and a conductive terminal disposed in the opening and in electric contact with the pad electrode, wherein the conductive terminal is in contact with the patterned metal layer at a bottom of the recess.

19. The semiconductor device assembly of claim 13, further comprising a peripheral pad electrode that is disposed on the top surface at a peripheral portion of the semiconductor die, a peripheral conductive terminal that is disposed in another opening of the supporting member formed at the peripheral portion and in electric contact with the peripheral pad electrode, and a wiring layer connecting the pad electrode and the peripheral conductive terminal.

20. A semiconductor device assembly comprising;
a semiconductor device comprising a semiconductor die comprising a top surface on which a device element is formed, a pad electrode disposed on the top surface, a supporting member disposed on the top surface and having an opening;
a circuit board on which the semiconductor device is mounted, the circuit board comprising an external electrode and having a recess in which the semiconductor device is disposed, the pad electrode and the external electrode being electrically connected through the opening;
a conductive terminal disposed in the opening and in electric contact with the pad electrode; and
a filling portion filling a space between a side of the semiconductor die and a side wall of the recess,
wherein a bottom surface of the semiconductor die is attached to a bottom of the recess,
the conductive terminal and the external electrode are connected by an external connection wiring, and
the external connection wiring is formed by printing conductive paste on the semiconductor die, the filling portion and the external electrode.

21. A semiconductor device assembly comprising:
a semiconductor device comprising a semiconductor die comprising a top surface on which a device element is formed, a pad electrode disposed on the top surface, a supporting member disposed on the top surface and having an opening;
a circuit board on which the semiconductor device is mounted, the circuit board comprising an external electrode and having a recess in which the semiconductor device is disposed, the pad electrode and the external electrode being electrically connected through the opening;
a peripheral pad electrode that is disposed on the top surface at a peripheral portion of the semiconductor die;
a peripheral conductive terminal that is disposed in another opening of the supporting member formed at the peripheral portion and in electric contact with the peripheral pad electrode;
a wiring layer connecting the pad electrode and the peripheral conductive terminal; and
a patterned metal layer embedded in the circuit board,
wherein the peripheral conductive terminal is in contact with the patterned metal layer at a bottom of the recess.

22. The semiconductor device assembly of claim 21, wherein the supporting member is made of a glass, a plastic or silicon.

23. A semiconductor device assembly comprising;
a semiconductor device comprising a semiconductor die comprising a top surface on which a device element is formed, a pad electrode disposed on the top surface, and a resin layer formed on the top surface and having an opening;
a circuit board on which the semiconductor device is mounted, the circuit board comprising an external electrode and having a recess in which the semiconductor device is disposed, the pad electrode and the external electrode being electrically connected through the opening; and
a filling portion filling a space between a side of the semiconductor die and a side wall of the recess,
wherein the external connection wiring is formed by printing conductive paste on the semiconductor die, the filling portion and the external electrode, and
a bottom surface of the semiconductor die is attached to a bottom of the recess, and the pad electrode is electrically connected with an external connection wiring that is physically connected with the external electrode.

24. A semiconductor device assembly comprising:
a semiconductor device comprising a semiconductor die comprising a top surface on which a device element is formed, a pad electrode disposed on the top surface, and a resin layer formed on the top surface and having an opening;

a circuit board on which the semiconductor device is mounted, the circuit board comprising an external electrode and having a recess in which the semiconductor device is disposed, the pad electrode and the external electrode being electrically connected through the opening;

a peripheral pad electrode that is disposed on the top surface at a peripheral portion of the semiconductor die;

a peripheral conductive terminal that is disposed in another opening of the resin layer formed at the peripheral portion and in electric contact with the peripheral pad electrode;

a wiring layer connecting the pad electrode and the peripheral conductive terminal; and a patterned metal layer embedded in the circuit board, wherein the peripheral conductive terminal is in contact with the patterned metal layer at a bottom of the recess.

25. The semiconductor device assembly of claim 24, wherein the resin layer is made of a photosensitive resin.

* * * * *